United States Patent [19]

Cunningham et al.

[11] Patent Number: 4,780,748
[45] Date of Patent: Oct. 25, 1988

[54] FIELD-EFFECT TRANSISTOR HAVING A DELTA-DOPED OHMIC CONTACT

[75] Inventors: John E. Cunningham, Eatontown; Erdmann F. Schubert, Hazlet; Won-Tien Tsang, Holmdel, all of N.J.

[73] Assignee: American Telephone & Telegraph Company, AT&T Bell Laboratories, Murray Hill, N.J.

[21] Appl. No.: 871,249

[22] Filed: Jun. 6, 1986

[51] Int. Cl.[4] .................. H01L 27/12; H01L 29/80; H01L 23/48
[52] U.S. Cl. ........................... 357/4; 357/22; 357/89; 357/90; 357/71
[58] Field of Search ............ 357/4, 4 SL, 22 A, 22 I, 357/22 K, 89, 90, 71

[56] References Cited

U.S. PATENT DOCUMENTS 4,205,329  5/1980  Dingle et al. .................... 357/16
4,583,110  4/1986  Jackson et al. .................. 357/65

OTHER PUBLICATIONS

"Ohmic Contacts for GaAs Devices", Solid–State Electronics, vol. 10 pp. 1213–1218, R. H. Cox et al., Pergamon Press 1967.
"In situ Ohmic–contact formatioln to n– and p– GaAs by molecular beam epitaxy", App. Phys. Let., 33, 12/15/78, W. T. Tsang, pp. 1022–1025.
"Nonalloyed and in situ ohmic contacts to highly doped n-type GaAs layers grown by molecular beam epitaxy (MBE) for field-effect transistors", J. App. Phy. 50, 2/79, J. V. DiLorenzo et al., pp. 951–954.
"Complex free-carrier profile synthesis by "atomic--plane" doping of MBE GaAs", J. App. Phy. 51, Jan. 1980, C. E. C. Wood, et al. pp. 383–387.
"Low–resistance nonalloyed ohmic contacts to Si--doped molecular beam epitaxial GaAs", App. Phy. Let. 47, 7/1/85, P. D. Kirchner, et al, pp. 26–28.
Radiative electron–hole recombination in a new sawtooth semiconductor superlattice grown by molecular--beam epitaxy", Phys. Rev. B, vol. 32, No. 2, 7/15/85, E. F. Schubert, et al., pp. 1085–1089.
"The Delta–Doped Field–Effect Transistor", Japanese Jnl. App. Phys., vol. 24, No. 8, Aug. 1985, E. F. Schubert, et al., pp. L608–L610.

Primary Examiner—Andrew J. James
Assistant Examiner—Robert P. Limanek
Attorney, Agent, or Firm—Daniel D. Dubosky; Oleg E. Alber

[57] ABSTRACT

A field-effect transistor is created on a GaAs semi-insulating substrate using molecular beam epitaxy by fabricating a delta-doped monolayer with a silicon dopant between two undoped GaAs layers grown over the semi-insulating substrate. A plurality of delta-doped monolayers are grown over the surface of the upper undoped layer interleaved with layers of GaAs having a thickness equal to or less than the tunneling width of electrons in GaAs. A channel is etched through the plurality of delta-doped monolayers to permit a gate electrode to contact the upper undoped GaAs layer. Source and drain electrodes are deposited over the delta-doped monolayers on each side of the channel.

5 Claims, 5 Drawing Sheets

FIELD-EFFECT TRANSISTOR HAVING A DELTA-DOPED OHMIC CONTACT

BACKGROUND OF THE INVENTION

This invention relates to field-effect transistors and more particularly to field-effect transistors that are grown by molecular beam epitaxial techniques.

One form of field-effect transistor that has recently been proposed in the art is a field-effect transistor where the current channel consists of a delta-doped monoplane between two undoped layers of GaAs. This delta-doped field-effect transistor was described in an article entitled "The δ-Doped Field-Effect Transistor," by E. F. Schubert and K. Ploog, *Japanese Journal of Applied Physics*, Vol. 24, No. 8, August, 1985, pp. L608–L610. In the Schubert et al. article, a 0.35 $\mu$m thick undoped GaAs layer is first grown on a semi-nsulating gallium arsenide (GaAs) substrate using molecular beam epitaxy (MBE). A Dirac-delta function-like doping profile is then implemented by interrupting the usual crystal-growth mode of GaAs during MBE by closing the Ga shutter, opening a silicon (Si) shutter and leaving the As shutter open. An As-stabilized crystal surface is thus maintained while the shutter of the Si-cell used for n-type doping is kept open, so that an impurity-growth mode results. During this mode the host crystal does not continue to grow. During growth of the normal crystal the (100) surface of GaAs contains about $6.25 \times 10^{14}$ Ga atoms cm$^{-2}$. The two-dimensional Si-concentration used for the delta-doping is smaller than the $10^{13}$ atoms cm$^{-2}$. Thus only a small selection of the Ga sites of one monolayer is occupied by the silicon atoms.

Following the delta-doped region a 300 Å thick undoped GaAs layer is grown. Finally source and drain electrodes are provided by alloying AuGe/Ni ohmic contacts at 450 degrees C. for three minutes at predetermined points on the surface of the undoped GaAs layer. A Schottky-gate is formed by a Cr/Au film which is positioned between the source and drain electrodes.

The Schottky delta-doped field-effect transistor is a considerable improvement over prior art field-effect transistors but it in turn could be considerably improved if a superior form of ohmic contact was used in place of the alloyed contacts presently used. As is known in the prior art, alloyed ohmic contacts suffer from the fact that donors with different chemical composition are formed thereby modifying the performance of the device. Alloying is also known to be disruptive in that it produces irregularities in the interface between the metal and the undoped semiconductor material. These irregularities in turn can result in unpredictable behavior for the field-effect transistor using these type contacts.

SUMMARY OF THE INVENTION

A new type of delta-doped field-effect transistor in III-V semiconductor material with a superior ohmic contact is provided in accordance with the present invention wherein the ohmic contact is achieved by fabricating a plurality of delta-doped donor layers at a predetermined distance from the metal to semiconductor junction provided by the source and drain electrodes. The plurality of delta-doped donor layers are separated from each other by a distance that is no greater than the tunneling width of electrodes in the III-V semiconductor material. A channel is etched through the delta-doped layers such that a film of chromium and gold can be deposited to form a gate electrode beneath the delta-doped layers. Source and drain electrodes made of titanium and gold are deposited over the delta-doped layers on each side of the channel occupied by the gate electrode.

BRIEF DESCRIPTION OF THE DRAWING

The invention will be better understood after reading the following detailed description in conjunction with the drawings wherein.

DETAILED DESCRIPTION

Figure 1:
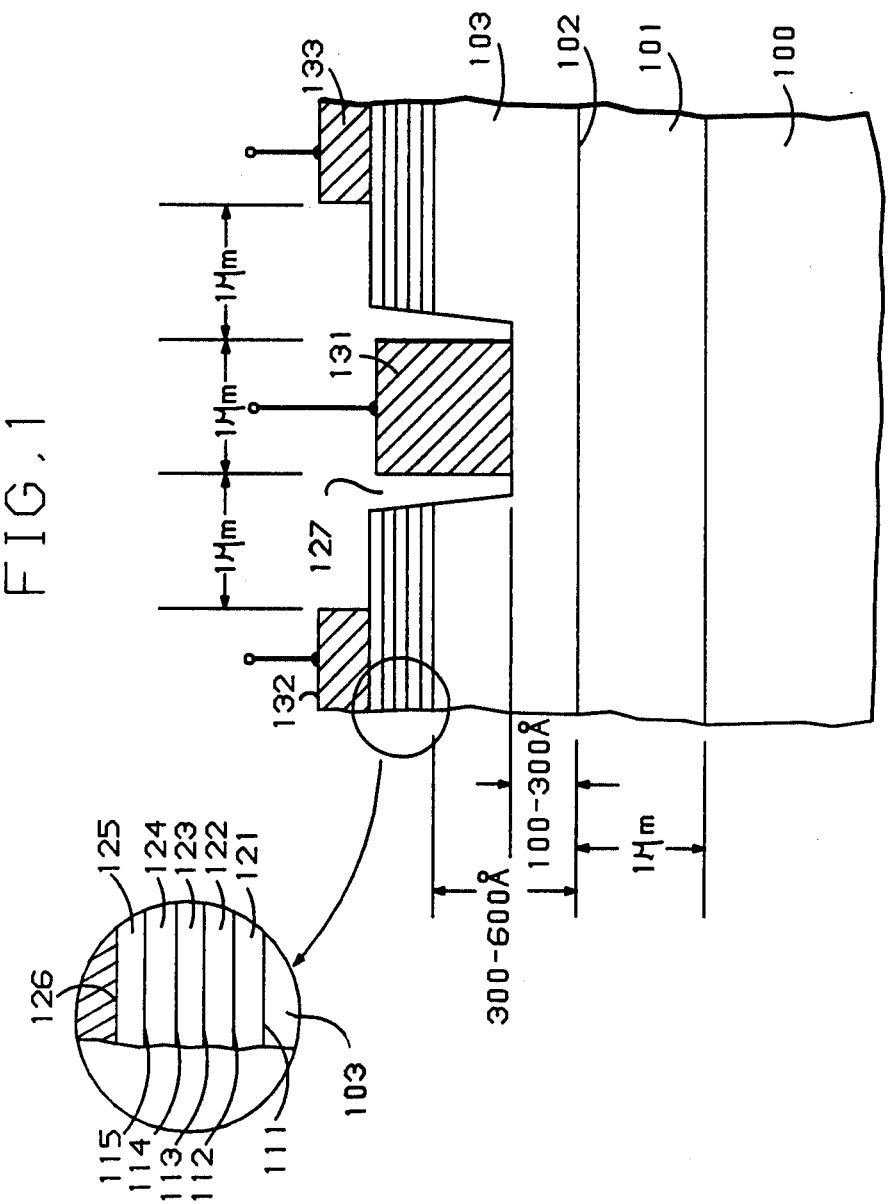
FIG. 1 is a cross-sectional diagram of a field-effect transistor constructed in accordance with the present invention.

A delta-doped field-effect transistor using the present invention wherein superior ohmic contacts are provided for both the source and drain electrodes is shown in cross-sectional form in FIG. 1. In this Figure, a semi-insulating GaAs substrate 100 is positioned in a vacuum generator model V80 moleular beam epitaxy (MBE) system equipped with two growth channels interconnected by a trolley interlock stage. In this system conventional effusion cells are charged with gallium and with silicon which will be used as the dopant material. Arsenic is also available in the growth channel by placing a tube of arsene (ASH$_3$) into a channel which is cracked by heating during the growth process. Initially the shutter of the Si cell is closed and a one micrometer thick layer 101 of undoped GaAs is grown on the semi-insulating GaAs substrate 100. At this point the Ga shutter is closed leaving the As shutter open, and the Si shutter is opened thereby permitting a deltadoped monolayer 102 to be grown over the undoped GaAs. The (100) crystal surface of the GaAs contains about $6.25 \times 10^{14}$ Ga atoms cm$^{-2}$. The Si shutter is kept open and the Ga shutter is kept closed until a silicon concentration of about $10^{13}$ atoms cm$^{-2}$ is obtained. Hence only a small fraction of the gallium sites in the monolayer is occupied by the silicon atoms. This level of silicon concentration was achieved by leaving the Si shutter open and the Ga shutter closed for about 23 minutes.

After the delta-doped layer 102 has been grown an undoped layer 103 of GaAs is then grown by reopening the Ga shutter and closing the Si shutter to obtain a layer 103 i having a thickness of about 300 to 600 Å. At this point the Ga shutter is again closed and the Si shutter opened for about 23 minutes to achieve a delta-doped layer 111. After fabrication of this layer 111 the undoped GaAs is again grown by opening the Ga shutter and closing the Si shutter to achieve an undoped layer 121 of GaAs having a thickness of about 20 Å. The process of growing a delta-doped layer and an undoped layer of GaAs having a thickness of 20 Å is then repeated to achieve the additional delta-doped layers 112 through 115 interleaved by undoped layers 122 through 125. This final undoped layer 125 of GaAs provides a surface 126 onto which the source and drain electrodes may be deposited.

A mask is used in a photolithographic process to etch a channel 127 at a position in the surface where the gate electrode is to be established. The etch is permitted to act for a period of time long enough such that the channel 127 cuts through all of the top five delta-doped layers 111 through 115 and into the undoped layer 103 of GaAs such that the bottom of the channel 127 is about 100 to 300 Å from the first delta-doped layer 102. After the usual cleaning steps following an etching process, a film of chromium and gold is deposited in channel 127 to establish the gate electrode 131. In the embodiment constructed the gate electrode has a width of about 1 micrometer. Finally titanium-gold contacts 132 and 133 are deposited over the undoped layer 125 at positions on the wafer where the source and drain electrodes are to be established. In the present embodiment these electrodes are about 1 micrometer from the edge of gate electrode 131.

Figure 2:
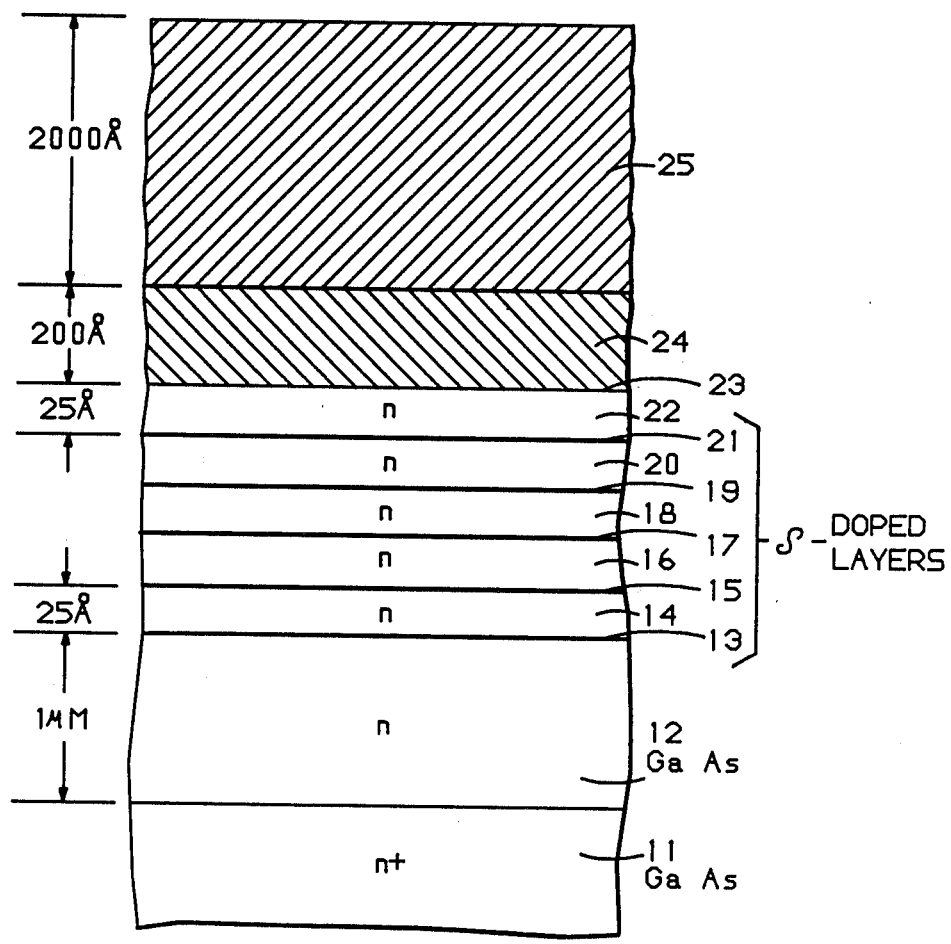
FIG. 2 is a cross-sectional diagram of a superior ohmic contact that is used in fabricating the embodiment shown in FIG. 1.

A better understanding of the ohmic contact which is used in the present invention can be obtained by the following discussion relating to the ohmic contact shown in cross-sectional form in FIG. 2. To develop the contact shown in this Figure, a heavily doped n+type gallium arsenide substrate 11 is placed in a Vacuum Generator model V80 Molecular Beam Epitaxy (MBE) system equipped with two growth chambers interconnected by a trolley interlock stage. In this system conventional effusion cells were used for evaporation of the group III elements and for evaporation of the dopant material. In the contacts which were grown, gallium was used as the group III element and the dopant material was silicon. The group V element, arsenic, was obtained from arsene (AsH$_3$) which was cracked by heating in the MBE chamber.

After substrate 11 is placed in the MBE apparatus a doped buffer layer 12 was permitted to grow on substrate 11 to a thickness of one micrometer with a three-dimensional dopant density N$_d$ equal to about $10^{18}$cm$^{-3}$. At this point in time, the growth of the N type gallium arsenide crystal was interrupted for 23 minutes by closing the gallium-effusion cell and permitting the crystal to be exposed only to the arsenic and silicon thereby permitting a delta-doped layer 13 to be grown on the buffer layer 12. By using the knowledge obtained from previous growths relating to the rate of silicon deposit the number of minutes required for a predetermined density of silicon may be calculated. In the embodiment which was constructed the crystal growth was interrupted for 23 minutes thereby achieving a silicon twodimensional density of about 5×$10^{13}$/cm$^2$. Since the crystal normally has approximately 6×$10^{14}$ group III elements per square centimeter this interruption of growth essentially places a silicon atom at about one out of ten gallium sites on the crystal. The gallium-effusion cell is again opened and the crystal is permitted to grow for about 25 Å thereby creating layer 14. The process of closing the gallium-effusion cell and regrowing the normal crystal is repeated during four more intervals resulting in the delta-doped layers 15, 17, 19 and 21 and the normal N doped crystal layers 16, 18, 20 and 22, all in FIG. 2.

Layers 13, 15, 17, 19 and 21 in FIG. 2 are called delta-doped layers in the present specification, but other terms have been used in the prior art. This type of doping essentially provides an increased amount of dopant in a single atomic plane or monolayer of the crystal. Accordingly some prior art have described this doping as atomic-plane doping. See the article entitled "Complex free-carrier profile synthesis by "atomic-plane" doping of MBE GaAs" by C. E. C. Wood, G. Metze, J. Berry and L. F. Eastman, *Journal of Applied Physics,* Vol. 51, January 1980, pp. 383–387, which article is incorporated herein by reference. Also see the article entitled "Radiative electron-hole recombination in a new sawtooth semiconductor super lattice growth by molecular-beam epitaxy," by E. F. Schubert, Y. Horikoshi and K. Ploog, *Physical Review B,* Vol. 32, No. 2, July 15, 1985, pp. 1085–1089, which article is also incorporated herein by reference. The term deltadoped comes from the Dirac-delta function which is a useful way to describe the charge density in the delta-doped monolayers even though it is not, strictly speaking, accurate since the Dirac-delta function has problematic physical meaning at its center.

Figure 3:
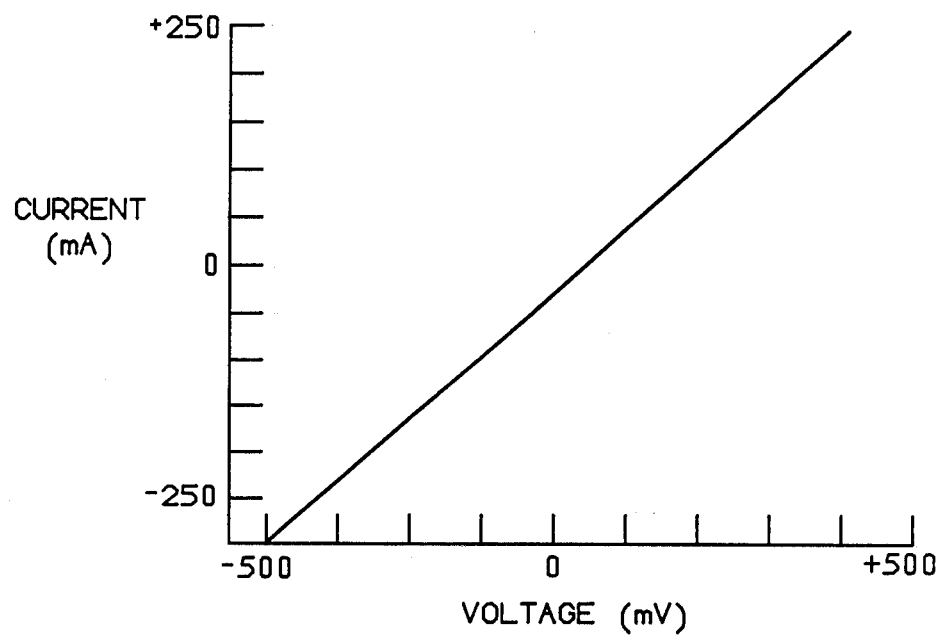
FIGS. 3 through 6 are curves and diagrams that are useful in describing the operation of the unique ohmic contact shown in FIGS. 1 and 2.

To complete the contact, chromium is deposited on the top surface 23 of layer 22 to a thickness of about 200 Å in order to establish layer 24 followed by an evaporation of about 2000 Å of gold to create a layer 25. Excellent linear ohmic characteristics were achieved for a delta-doped contact having a radius of 255 micrometers. The current versus voltage characteristic of this contact is shown in FIG. 3. The total resistance of 1.4 ohms demonstrates the high potential of the present ohmic contact method. As indicated in FIG. 3 the current voltage characteristic exhibits strictly linear behavior with S- and N- shaped patterns absent on all scales.

Figure 4:
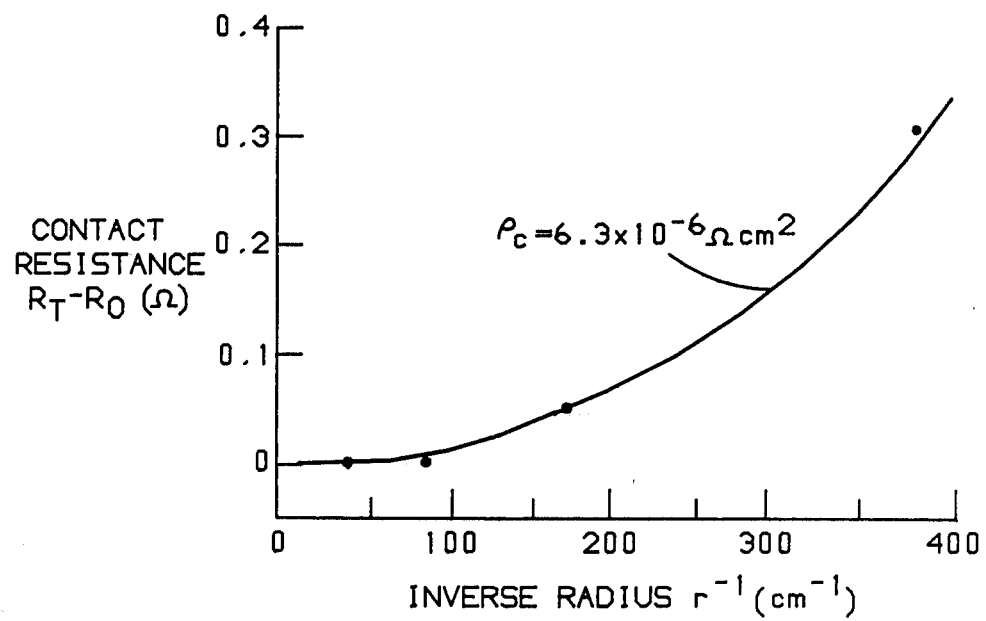

To determine a specific contact resistance the equations developed by Cox and Strack were utilized. See the article entitled "Ohmic Contacts for GaAs Devices", by R. H. Cox and H. Strack, *Solid State Electronics,* Vol. 10, pages 1213–1218, 1967. A plot of the contact resistance ($R_t$–$R_o$) versus the inverse radius size of the contact is shown in FIG. 4. To obtain the experimental points contacts with different size radii were established and measured and compared with the theoretical curve predicted by Cox and Strack. As indicated in FIG. 4 the calculated fit to the experimental data yields a specific contact resistance of about 6.3×$10^{-6}$ ohm-cm$^2$.

The surface of the ohmic contact metal remained smooth because these contacts require no alloying. The problems of balling-up in conventionally alloyed AuGe-based contacts were consequently avoided. Prior to establishing the chromium and gold metal layers on the surface a study was made of the surface morphology of the delta-doped GaAs layers using an optical microscope. No defects originating from the delta-doped layers were found.

As pointed out hereinabove, the silicon in the delta-doped layer achieved a two-dimensional doping concentration of 5×$10^{13}$/cm$^2$. In the crystal which was grown which has a lattice constant of 5.6 Å this two-dimensional doping concentration has yielded a three-dimensional silicon concentration of about $10^{21}$cm$^{-3}$. This doping concentration is far in excess of what can be achieved through the normal crystal growth using silicon as a dopant. Accordingly a lower resistance contact has been obtained as a result.

Figure 5:
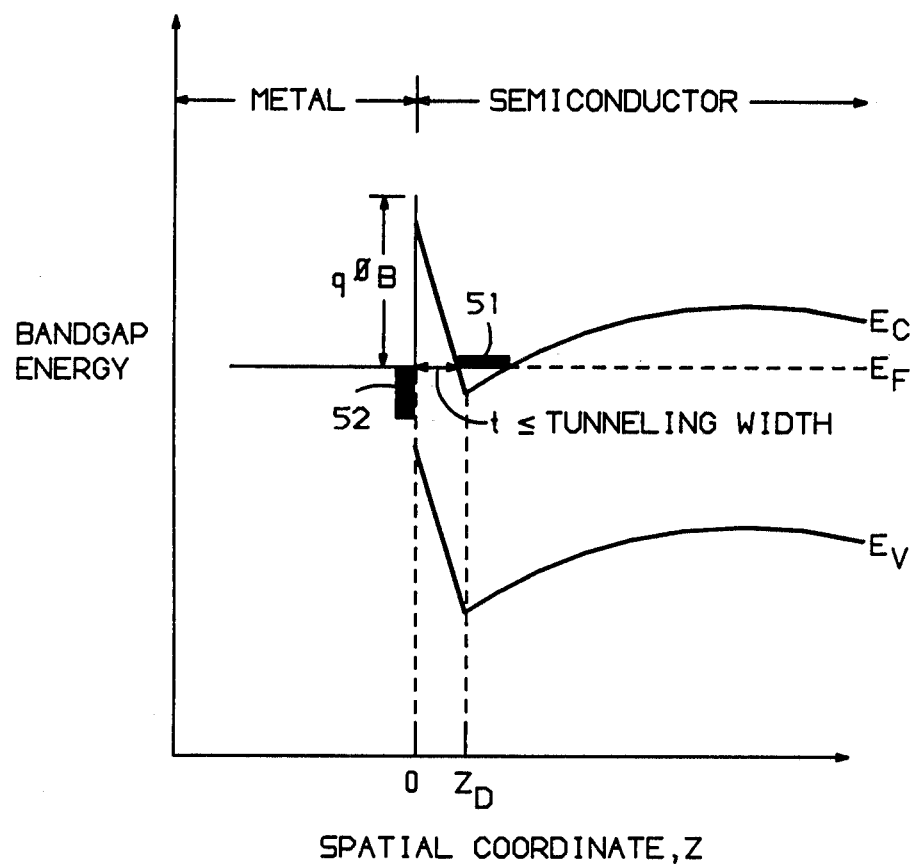

A theoretical understanding of the contacts used in the present invention can be achieved by studying the band gap energy diagram shown in FIG. 5. The diagram shown in FIG. 5 is for a metal to semiconductor interface where a single delta-doped layer has been fabricated at a distance of $Z_d$ from the interface. In this diagram, $E_C$ is the edge of conduction energy, $E_F$ is the Fermi energy, $E_V$ is the edge of the valenc-band energy, q is the elementary charge, $\phi_B$ is the potential height of the Schottky barrier at the metal semiconductor interface, $q\phi_B$ is the energy height of the Schottky barrier at the metal semiconductor interface, and $Z_D$ is the distance from the interface to the delta-doped atomic layer. This diagram is similar to the one shown in FIG. 1 of the article entitled "The Delta-Doped Field Effect Transistor" by E. F. Schubert et al., *Japanese Journal of Applied Physics*, Vol. 24, No. 8, August 1985, pp. L608–L610. The difference which creates the present invention is that the delta-doped monlayer is placed at a distance $Z_d$ from the metal to semiconductor interface such that the tunneling barrier t is thin, and consequently quantum-mechanical tunneling through the barrier provides the dominant transport mechanism. As shown in FIG. 5 the delta-doped monolayer creates a reservoir of electrons 51 at a distance t from the metal to semiconductor interface. A major fraction of these electrons which originate from donors of the delta-doped layer occupy surface states at the metal-semiconductor interface, as illustrated in FIG. 5 by the numeral 52.

Figure 6:
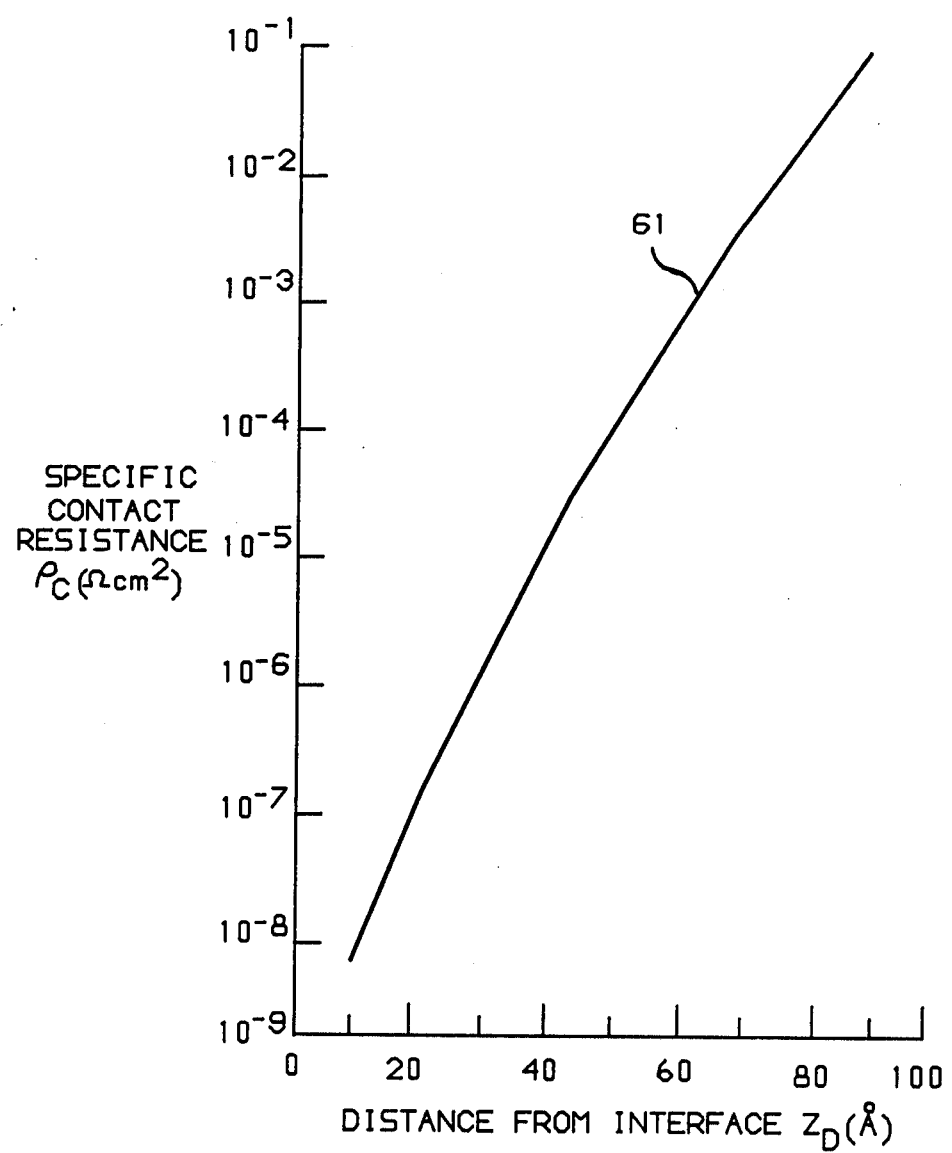

A theoretical analysis of a single monolayer can be conducted to obtain an expression for the specific contact resistance versus distance from the interface $Z_d$. This expression has been plotted in FIG. 6 and shown as curve 61. As indicated in FIG. 6 a distance from the interface of 25 Å theoretically yields a specific contact resistance of $10^{-7}$ ohm-cm$^2$. This compares favorably with the measured specific contact resistance illustrated in FIG. 4 where a specific contact resistance of $6.3 \times 10^{-6}$ ohm-cm$^2$ was obtained. As also indicated in FIG. 6, further development work may yield contact resistances in the range of $10^{-7}$ to $10^{-9}$ ohm-cm$^2$. As shown in FIG. 6 the contact resistance is low as long as the distance from the interface for the delta-doped monolayer is on the order of the lattice constant. As in the present embodiment a plurality of delta-doped layers may be utilized in order to insure low contact resistance.

Numerous departures from the present embodiment may be made without departing from the spirit and scope of the present invention. For example elements from group IV in the periodic table of elements, for example, ggermanium and tin, may also be utilized in order to produce n-type gallium arsenide. Similarly, elements from group VI, for example, sulfur, selenium, and tellurium, may also be utilized in order to produce n-type gallium arsenide. To produce P-type delta-doped monolayers, elements from group II, for example, beryllium and magnesium, as well as manganese and zinc, may be used.

What is claimed is:

1. A field-effect transistor comprising a substrate of semi-insulating semiconductor material, first layer of said semiconductor material grown over said substrate, second layer of said semiconductor material grown over said first layer, at least one delta-doped monolayer having a predetermined dopant juxtaposed between said first and second semiconductor layers, and source, gate and drain electrodes fabricated from a metallic conducting material, characterized in that a plurality of delta-doped monolayers are interposed between said source and drain electrodes and said second semiconductor layer, said plurality of delta-doped monolayers being separated from each other and from the source and drain electrodes by layers of semiconductor material each one of which has a thickness equal to or less than the tunneling width of electrons in said semiconductor material, and said gate electrode is positioned in a channel that is cut through said plurality of delta-doped monolayers such that the gate electrode is in direct contact with said second semiconductor layer.

2. A field-effect transistor as defined in claim 1 wherein said semiconductor material is GaAs and said dopant is silicon.

3. A field-effect transistor comprising a semiconductor substrate, first and second semiconductor layers grown on said substrate, at least one delta-doped monolayer having a predetermined dopant juxtaposed between said first and second semiconductor layers, a channel etched in said second layer thereby defining ridges of semiconductor material on each of its sides, a gate electrode positioned in said channel, a plurality of delta-doped monolayers fabricated on the ridges on each side of said channel, and interleaved with layers of semiconductor material having a predetermined thickness, said predetermined thickness being equal to or less than the tunneling width of electrons in said semiconductor material, and metal electrodes positioned on said plurality of delta-doped layers on each side of said channel.

4. A field-effect transistor as defined in claim 3 wherein said semiconductor material is GaAs and said dopant is silicon.

* * * * *